United States Patent
Moriya et al.

[11] Patent Number: 6,013,944
[45] Date of Patent: *Jan. 11, 2000

[54] SEMICONDUCTOR DEVICE IN WHICH CHIP ELECTRODES ARE CONNECTED TO TERMINALS ARRANGED ALONG THE PERIPHERY OF AN INSULATIVE BOARD

[75] Inventors: Susumu Moriya; Norio Fukasawa; Shirou Youda, all of Kawasaki, Japan

[73] Assignee: Fujitsu Limited, Kawasaki, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/912,371

[22] Filed: Aug. 18, 1997

[30] Foreign Application Priority Data

Feb. 10, 1997 [JP] Japan ................................. 9-026931

[51] Int. Cl.⁷ ................................................. H01L 23/495
[52] U.S. Cl. ........................... 257/668; 257/673; 257/778
[58] Field of Search ..................... 257/668, 669, 257/673, 778, 692

[56] References Cited

U.S. PATENT DOCUMENTS

| | | | |
|---|---|---|---|
| 4,918,511 | 4/1990 | Brown | 357/70 |
| 5,148,265 | 9/1992 | Khandros et al. | 257/773 |
| 5,258,648 | 11/1993 | Lin | 257/778 |
| 5,293,067 | 3/1994 | Thompson et al. | 257/668 |
| 5,302,854 | 4/1994 | Nishiguchi et al. | 257/737 |
| 5,510,758 | 4/1996 | Fujita et al. | 333/247 |
| 5,528,458 | 6/1996 | Yasuho et al. | 361/718 |
| 5,616,958 | 4/1997 | Laine et al. | 257/717 |
| 5,659,952 | 8/1997 | Kovac et al. | 29/840 |
| 5,677,575 | 10/1997 | Maeta et al. | 257/778 |
| 5,703,405 | 12/1997 | Zeber | 257/777 |
| 5,874,784 | 2/1999 | Aoki et al. | 257/787 |

*Primary Examiner*—Mahshid Saadat
*Assistant Examiner*—George C. Eckert, II
*Attorney, Agent, or Firm*—Armstrong, Westerman, Hattori, McLeland & Naughton

[57] ABSTRACT

A semiconductor device including a semiconductor chip; a plurality of electrodes provided on a surface of the semiconductor chip; an insulative board which includes a plurality of conductive patterns, one end of each of the plurality of conductive patterns being protruded from a periphery of the insulative board so as to function as an outer terminal; a connecting element for electrically connecting the outer terminal to a corresponding one of the plurality of electrodes; and a conductive element which is in electrical contact with a corresponding one of the plurality of conductive patterns.

15 Claims, 23 Drawing Sheets

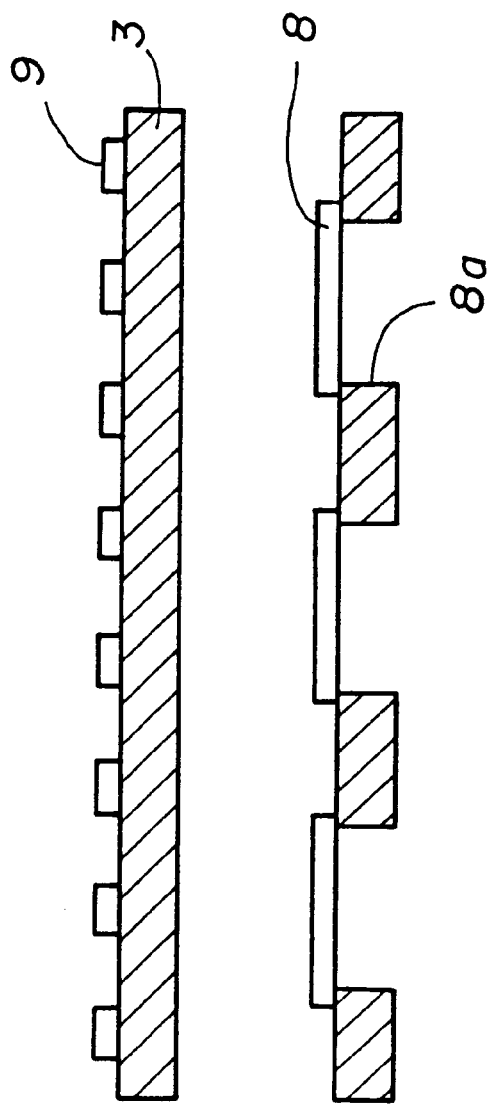

SEMICONDUCTOR DEVICE IN WHICH CHIP ELECTRODES ARE CONNECTED TO TERMINALS ARRANGED ALONG THE PERIPHERY OF AN INSULATIVE BOARD

BACKGROUND OF THE INVENTION

1. Field of the Invention

The present invention generally relates to semiconductor devices and methods for producing semiconductor devices, and particularly, to a package structure of a semiconductor device so a surface-mount type which makes a high-density mounting possible and a method for producing such a package structure of a semiconductor device. The size of the package is about the same as the size of a semiconductor chip (element) on which a plurality of bumps are provided over the entire surface thereof.

Recently, semiconductor chips have been highly integrated so that the size thereof may be reduced in accordance with a reduction in size of an electronic device such as a handy-phone. Accordingly, there are demands for a package for a semiconductor device having a size which is suitable for containing a size-reduced semiconductor device and for a method for producing such a package for a semiconductor device.

2. Description of the Related Art

FIG. 1 is a diagram showing a conventional flip-chip type semiconductor device. A flip-chip mounting technique is used to reduce the size of a semiconductor chip and mount it on a board.

In FIG. 1, the semiconductor device includes a semiconductor chip 101, a plurality of bumps 102 connected to respective electrodes formed on the semiconductor chip 101, a mounting board 103 on which a plurality of lands for mounting respective bumps 102 are provided, and a resin 104 for sealing the semiconductor chip 101 and the plurality of bumps 102.

As for the structure of the semiconductor device shown in FIG. 1, each of the electrodes formed on the surface of the semiconductor chip 101 is directly connected to the respective land on the mounting board 103 via the corresponding bump 102. Then, the resin 104 is inserted between the semiconductor chip 101 and the mounting board 103 in order to absorb the difference in thermal expansion coefficient therebetween and to protect the surface of the semiconductor chip 101 and the plurality of bumps 102.

In the flip-chip bonding shown in FIG. 1, it is necessary, as mentioned above, to insert the resin 104 between the semiconductor chip 101 and the mounting board 103 in order to prevent a destruction of the bumps 102 due to stress applied thereto which is caused by the difference in the thermal expansion coefficient between the semiconductor chip 101 and the mounting board 103 when heat is applied to the device after mounting. However, it is difficult to inject the resin therebetween without generating voids and a complicated filling process become necessary to avoid the generation of voids. Also, since the bumps 102 are hidden by the resin after mounting, it is difficult to examine the connection state of the bumps 102.

Moreover, since the bumps 102 are provided on the semiconductor chip 101, the number of steps in a wafer process is increased and hence the cost for producing the semiconductor device is also increased.

SUMMARY OF THE INVENTION

Accordingly, it is a general object of this invention to provide a semiconductor device and a method for producing semiconductor devices in which the above-mentioned problems are eliminated.

A more specific object of the present invention is to provide a package structure of a semiconductor device in which no resin is required for filling between a semiconductor chip and a mounting board and a method for producing such a package structure of the semiconductor device.

It is another object of the present invention to provide a package structure of a semiconductor device in which a bonding portion of a semiconductor chip and a mounting board is not destroyed by a thermal stress after mounting and a method for producing such a package structure of the semiconductor device.

It is still another object of the present invention to provide a package structure of a semiconductor device in which the bonding portion of a semiconductor chip and a mounting board may be examined after mounting and a production cost thereof is relatively low and a method for producing such a package structure of the semiconductor device.

The objects described above are achieved by a semiconductor device comprising: a semiconductor chip; a plurality of electrodes provided on a surface of the semiconductor chip; an insulative board which includes a plurality of conductive patterns, one end of each of the plurality of conductive patterns protruding from a periphery of the insulative board so as to function as an outer terminal; a connecting means for electrically connecting the outer terminal to a corresponding one of the plurality of electrodes; and a conductive element which is in electrical contact with a corresponding one of the plurality of conductive patterns.

The objects described above are also achieved by the semiconductor device, wherein the insulative board is provided on the surface of the semiconductor chip so that peripheral portions of the insulative board are positioned in the vicinity of the plurality of electrodes.

The objects described above are also achieved by the semiconductor device, wherein an elastic adhesive layer is provided between the insulative board and the semiconductor chip.

According to the above semiconductor device, since the insulative board, which includes the plurality of conductive patterns, is provided on the semiconductor chip and the electrodes of the semiconductor chip are connected to the respective conductive elements by the conductive patterns, it becomes possible to electrically connect the electrodes around the semiconductor chip to the conductive elements which may be formed on the entire surface of the semiconductor chip. Thus, the interval between each of the conductive elements may be increased so as to be greater than the interval between each of the electrodes, and hence a stable mounting of the device may be realized.

Also, since the insulative board is provided on the semiconductor chip and the conductive patterns are provided on the semiconductor chip, it is not necessary to insert a resin between the semiconductor chip and the insulative board after mounting the semiconductor chip on the insulative board. This is because thermal stress caused by the difference in the thermal expansion coefficient between the semiconductor chip and a mounting board may be absorbed by the flexibility of the outer terminals. Moreover, the thermal stress caused by the difference in the thermal expansion coefficient between the semiconductor chip and a printing board upon heating may also be absorbed by the elastic adhesive layer. Accordingly, there is no need to insert the resin between the semiconductor chip and the mounting board after mounting. Further, since a bonding portion is not hidden by the resin, it is easy to examine the connection state of the bonding portion.

In addition, since bumps are not formed on the semiconductor chip by the wafer process as in the conventional flip-chip mounting, a semiconductor device having an area bump structure may be realized at a considerably low manufacturing cost.

The objects described above are also achieved by the semiconductor device, wherein a land having a greater width than the plurality of conductive patterns is provided at an end portion of a corresponding one of the plurality of conductive patterns.

According to the above semiconductor device since the land having a greater width is provided, it becomes easy to form the conductive elements.

The objects described above are also achieved by the semiconductor device, wherein a plurality of opening portions are provided in the insulative board corresponding to positions of the land.

According to the above semiconductor device, due to the presence of the opening portions, the conductive element may be securely held by the corresponding opening portion.

The objects described above are also achieved by the semiconductor device, wherein the conductive element is a bump, a portion of the bump being embedded in a corresponding one of the plurality of opening portions so as to be in contact with the land and another portion of the bump being projected from the insulative board.

According to the above semiconductor device, since the portion of the bump is projected from the insulative board, the contact between the bump and the mounting board may be secured.

The objects described above are also achieved by the semiconductor device, wherein the plurality of conductive patterns are embedded in the insulative board.

According to the above semiconductor device, since the conductive patterns are embedded in the insulative board, the thickness of the semiconductor device may be reduced.

The objects described above are also achieved by the semiconductor device, wherein the outer terminal is in a curved shape.

According to the above semiconductor device, since the outer terminal is in the curved shape, stress which may be applied to the outer terminal and the corresponding electrode of the semiconductor chip during a bonding process may be relieved.

The objects described above are also achieved by the semiconductor device, wherein the insulative board includes a central hole and slits extending from the periphery of the insulative board toward a center portion of the insulative board.

According to the above semiconductor device, since the insulative board is provided with the slits, stress caused by the difference in the thermal expansion coefficient between the mounting board and the semiconductor chip may be efficiently absorbed by the slits. Also, the central hole functions as an opening to evacuate the air during a bonding process to the semiconductor chip.

The objects described above are also achieved by the semiconductor device, wherein the shape of the outer terminal is a bent shape so as to be in electrical contact with a corresponding one of the plurality of electrodes.

According to the above semiconductor device, it becomes possible to absorb the difference in height of the bumps on the corresponding electrode by the outer terminal. Also, since the outer terminal is in a bent shape, the outer terminal may be connected to the respective electrode of the semiconductor chip without providing bumps of a high height.

The objects described above are also achieved by the semiconductor device, wherein a sealing resin is provided on a portion connecting the outer terminal to a corresponding one of the plurality of electrodes.

According to the above semiconductor device, since the sealing resin is provided on the connecting portions of the outer terminal and the electrode, the reliability of the connecting portions may be improved.

The objects described above are achieved by a semiconductor device comprising: a semiconductor chip; a plurality of electrodes provided on a surface of the semiconductor chip; an insulative board which includes a plurality of conductive patterns, one end of each of the plurality of conductive patterns being exposed at a side surface of the insulative board so as to function as an outer terminal; and a connecting means for electrically connecting the outer terminal to a corresponding one of the plurality of electrodes.

The objects described above are also achieved by the semiconductor device, wherein the insulative board is provided on the surface of the semiconductor chip so that periphery portions of the insulative board are positioned in the vicinity of the plurality of electrodes.

The objects described above are also achieved by the semiconductor device, wherein an elastic adhesive layer is provided between the insulative board and the semiconductor chip.

According to the above semiconductor device, since the insulative board may be positioned significantly close to the plurality of electrodes, the size of the insulative board may be increased accordingly. Also, the region assigned for the conductive patterns may also be increased.

The objects described above are also achieved by the semiconductor device, wherein a sealing resin is provided on a portion connecting the outer terminal to a corresponding one of the plurality of electrodes.

According to the above semiconductor device, since the sealing resin is provided on the connecting portions of the outer terminal and the electrode, the reliability of the connecting portions may be improved.

The objects described above are achieved by a semiconductor device comprising: a semiconductor chip; a plurality of electrodes provided on a surface of the semiconductor chip; an insulative board which includes a plurality of conductive patterns provided with the insulative board, one end of each of the plurality of conductive patterns being provided with a bonding pad, which has a greater width than the conductive patterns, at a position in the vicinity of a periphery of the conductive board; and a bonding wire which connects the bonding pad to a corresponding one of the plurality of electrodes.

The objects described above are also achieved by the semiconductor device, wherein the insulative board is provided on the surface of the semiconductor chip so that periphery portions of the insulative board are positioned in the vicinity of the plurality of electrodes.

The objects described above are also achieved by the semiconductor device, wherein an elastic adhesive layer is provided between the insulative board and the semiconductor chip.

According to the above semiconductor device, since the bonding wire absorbs stress in a manner similar to the above-mentioned outer terminal, the same effect as the outer terminal may be obtained.

Other objects and further features of the present invention will be apparent from the following detailed description when read in conjunction with the accompanied drawings.

BRIEF DESCRIPTION OF THE DRAWINGS

FIG. 6A is a diagram showing a cross-sectional view of the insulative board cut along the 6A–6A' line shown in FIG. 5;

FIG. 6B is a diagram showing a cross-sectional view of the insulative board cut along the 6B–6B' line shown in FIG. 5;

DESCRIPTION OF THE PREFERRED EMBODIMENTS

In the following, a description will be given of embodiments of a semiconductor device and a method for producing the semiconductor device according to the present invention with reference to the accompanied drawings.

Figure 2:
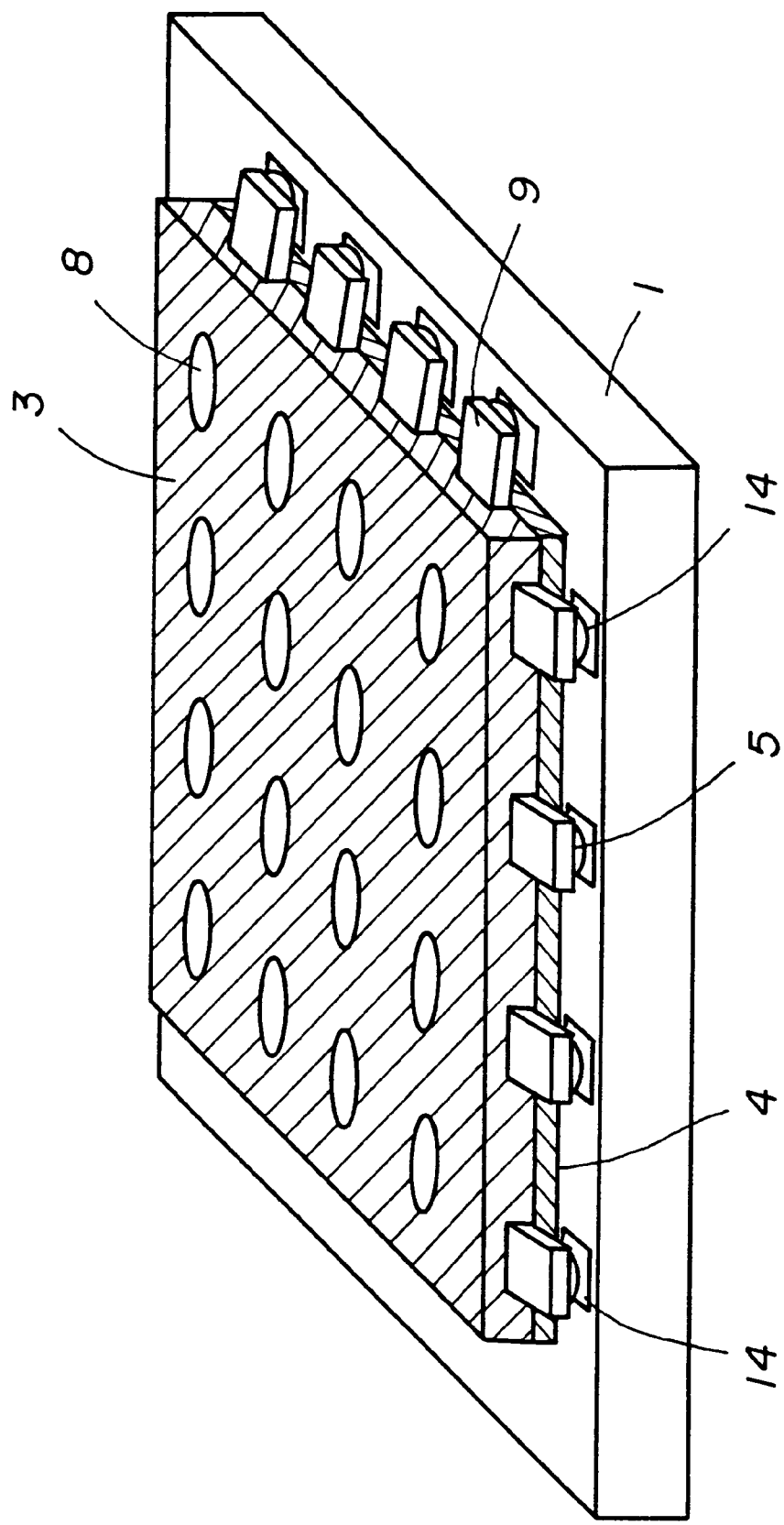
FIG. 2 is a diagram showing a perspective view of a semiconductor device according to an embodiment of the present invention.
Figure 3:
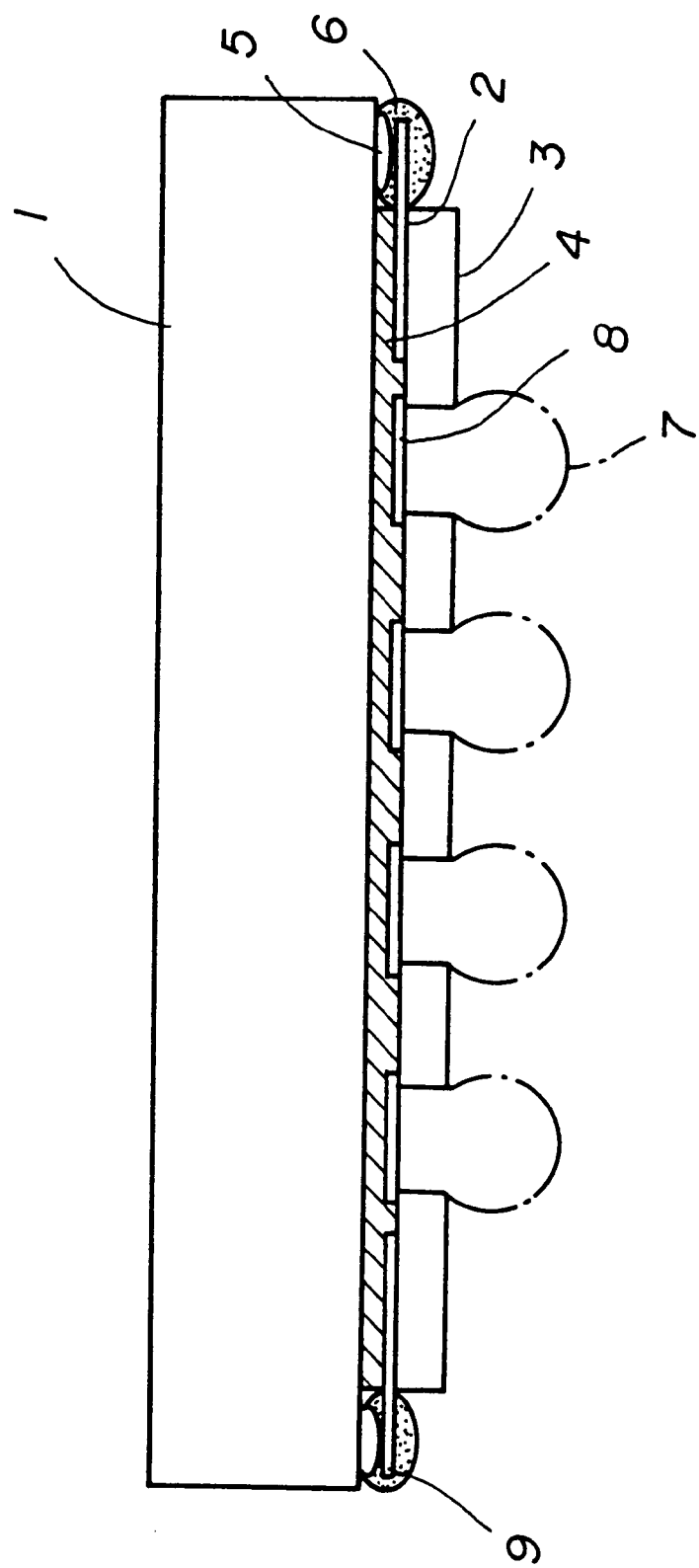
FIG. 3 is a diagram showing a cross section of the semiconductor device.
Figure 4:
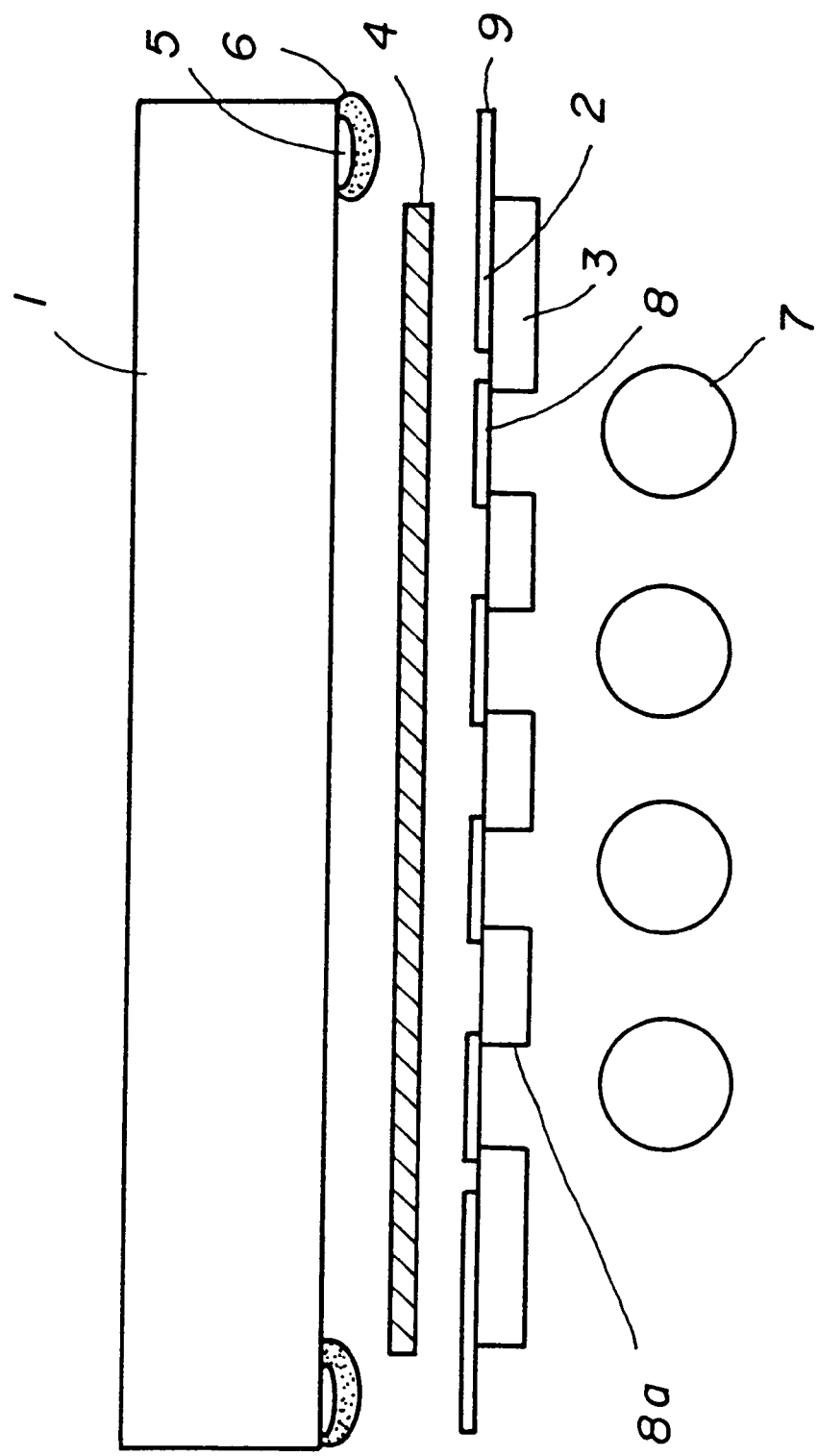
FIG. 4 is a diagram showing an exploded view of the semiconductor device.

FIG. 2 is a diagram showing a perspective view of a semiconductor device according to an embodiment of the present invention. FIG. 3 is a diagram showing a cross-section of the semiconductor device and FIG. 4 is a diagram showing an exploded view of the semiconductor device. Note that in FIG. 2 the semiconductor device is shown upside down, as compared with FIGS. 3 and 4, and conductive wax material 6 (eg., solder) is omitted.

In FIGS. 2 through 4, the semiconductor device is comprised of a semiconductor chip 1, and a plurality of bumps 5, each of which is provided on a respective electrode 14. Each of the electrodes 14 is connected to a circuit located in the semiconductor chip 1. A plurality of conductive patterns 2, each of which may be formed of a copper foil, are provided on an insulative board 3 which may be formed of polyimide. The insulative board 3 is formed in an inner region with respect to the plurality of electrodes 14 which are provided around the semiconductor chip 1. The insulative board 3 is connected to the semiconductor chip 1 via an elastic adhesive layer 4. The elastic adhesive layer 4 may be made of an epoxy-type adhesive composition.

Figure 5:
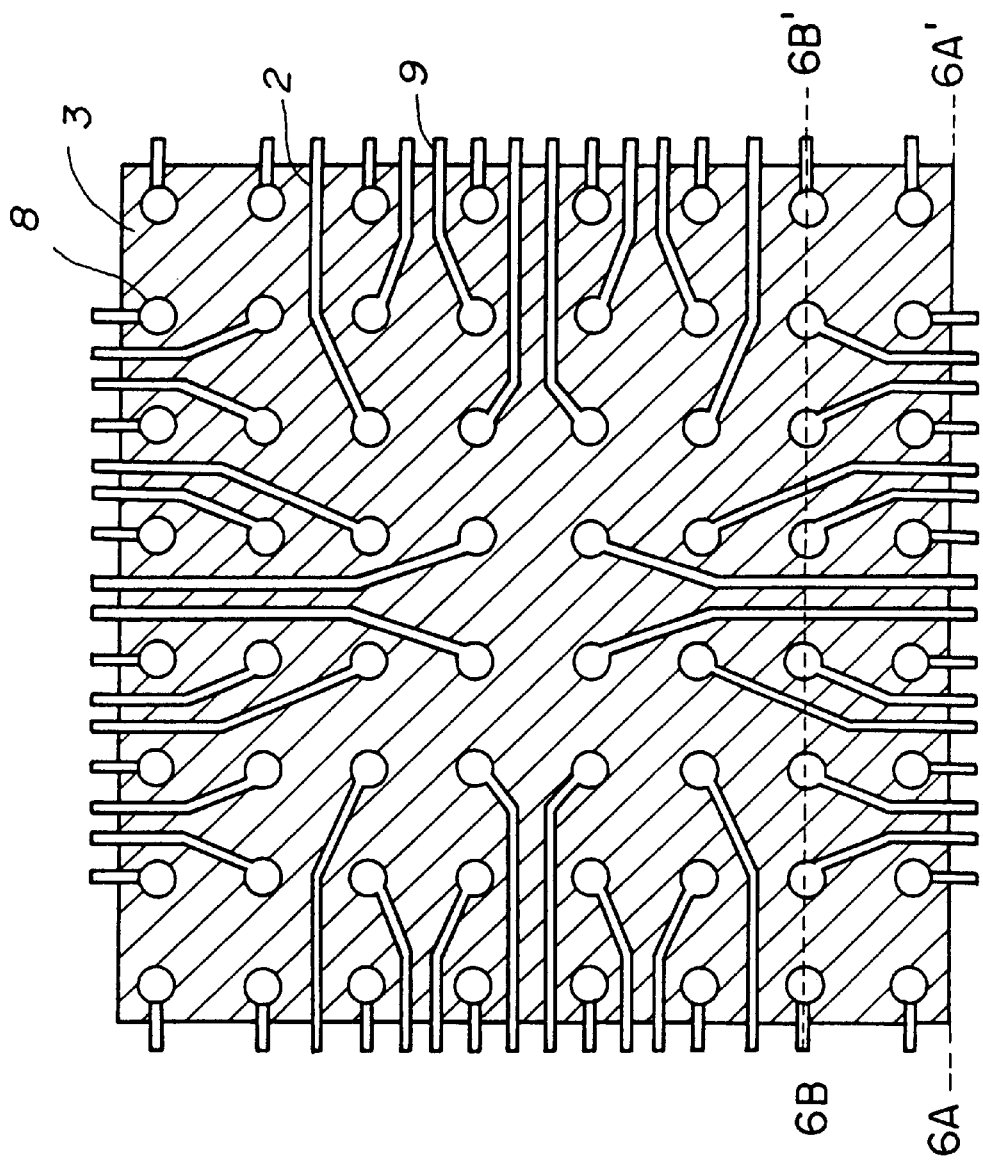
FIG. 5 is a diagram showing a plan view of an insulative board according to an embodiment of the present invention.

The conductive patterns 2 may be formed by etching a copper foil formed on the entire surface of the insulative board 3 having a thickness of about 0.5 mm to 1 mm. In practice, as shown in FIG. 5, each of the conductive patterns 2 extends towards a center of the semiconductor chip 1 from a respective outer terminal 9 which is connected to the corresponding electrode 14 of the semiconductor chip 1. The width and thickness of each of the conductive patterns 2 is usually about 50 to 100 $\mu$m and about 20 to 50 $\mu$m, respectively, and a land 8 of about 0.1 to 0.5 mm diameter is provided at the end thereof. Each of the outer terminals 9 protrudes about 0.5 to 1 mm from the periphery of the insulative board 3 so that it is connected to the corresponding bump 5 via the wax material 6 such as solder.

The plurality of lands 8 are provided over the entire surface of the insulative board 3, i.e., the entire lower surface of the semiconductor chip 1. Also, each of the lands 8 is exposed by an opening 8a formed in the insulative board 3 so that it is connected to a mounting board via a respective bump 7.

As mentioned above, according to the above embodiment of the present invention shown in FIGS. 2 through 5, since an area bump structure, in which the electrodes 14 around the semiconductor chip 1 are connected to the bumps 7 provided over the entire (lower) surface of the semiconductor chip 1 by the respective conductive patterns 2, may be formed, it becomes possible to increase the intervals between the bumps 7 to be greater than the intervals between the electrodes 14 and, hence, a mounting operation can be securely performed.

Also, although a resin is applied between a semiconductor chip and a printing board after mounting in a conventional flip-chip semiconductor device, it is not necessary for the semiconductor device of the present invention to apply the resin between the semiconductor chip and the printing board. This is due to the function of the elastic adhesive layer 4 provided between the semiconductor chip 1 and the insulative board 3.

That is, since each of the outer terminals 9 protrudes from the insulative board 3, thermal stress caused by the difference in the thermal expansion coefficient between the semiconductor chip 1 and the printing board upon heating may be absorbed by the flexibility of the outer terminals 9. Moreover, the thermal stress caused by the difference in the thermal expansion coefficient between the semiconductor chip 1 and the printing board upon heating may also be absorbed by the elastic adhesive layer 4. Accordingly, as mentioned above, there is no need to apply the resin between the semiconductor chip 1 and the printing board after mounting.

Further, since no bumps are formed on the semiconductor chip 1 by a wafer process as in the case of a conventional flip-chip mounting, it is possible, according to the present invention, to produce the semiconductor device having the area bump structure at a lower cost as compared with the conventional flip-chip semiconductor device.

Next, the conductive patterns 2 and the insulative board 3 will be explained with reference to FIGS. 5 and 6.

FIG. 5 is a diagram showing a plan view of the insulative board 3 on which the conductive patterns 2 and the plurality of lands 8 are formed. FIG. 6A is a diagram showing a cross-sectional view of the insulative board 3 cut along the 6A–6A' line shown in FIG. 5 and FIG. 6B is a diagram showing a cross-sectional view of the insulative board 3 cut along the 6B–6B' line shown in FIG. 5.

As mentioned above, the insulative board 3 may be made of polyimide and the size thereof is smaller than that of the semiconductor chip 1.

The conductive pattern 2 is formed on the insulative board 3 in a desired shape by carrying out an etching process. The outer terminals 9 projecting from the insulative board 3 about 0.1 to 0.5 mm are also formed by an etching process. A wax material may be applied to the outer terminals 9 if necessary to make contact with the semiconductor chip 1. As mentioned above, the lands 8 may be formed on the entire surface of the insulative board 3 so that the mounting efficiency may be increased.

The conductive pattern 2 is provided on the insulative board 3 as shown in FIG. 6A along the 6A–6A' cross section of FIG. 5. On the other hand, the lands 8 are provided on the opening portions 8a as shown in FIG. 6B along the 6B–6B' cross section of FIG. 5 and the bump 7 is formed on the corresponding land 8. In this manner, a part of the bump 7 is embedded in the opening 8a so that the bump 7 is strongly supported by the insulative board 3. The opening portions 8a are formed by subjecting the insulative board 3 to an etching process.

Figures 7A, 7B:
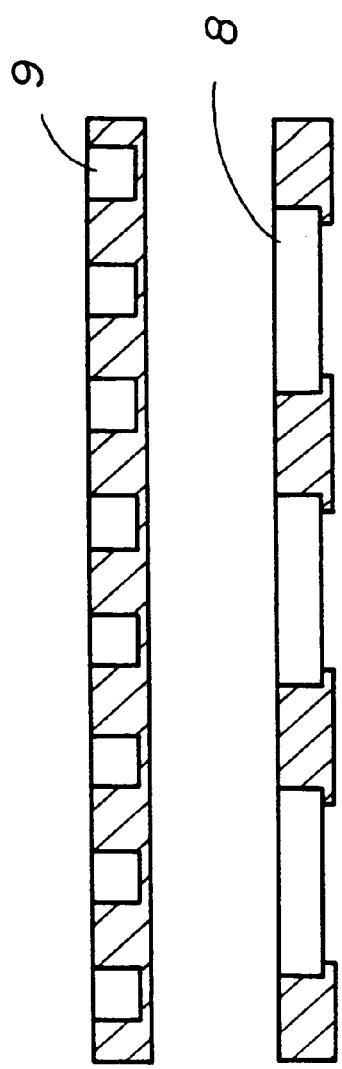
FIG. 7A is a diagram showing a modified embodiment of the insulative board according to the present invention.
FIG. 7B is a diagram showing a modified embodiment of the insulative board according to the present invention.

FIGS. 7A and 7B, respectively, are diagrams showing a modified embodiment of the insulative board (conductive patterns) according to the present invention. As shown in FIGS. 7A and 7B, the conductive pattern may be embedded in the insulative board. In this manner, the thickness of the insulative board may be further decreased as compared with the case shown in FIGS. 6A and 6B. The conductive pattern may be embedded in the insulative board as shown in FIGS. 7A and 7B by forming the conductive pattern on the insulative board made of polyimide and embedding the polyimide between the conductive patterns by spin coating.

Figure 8:
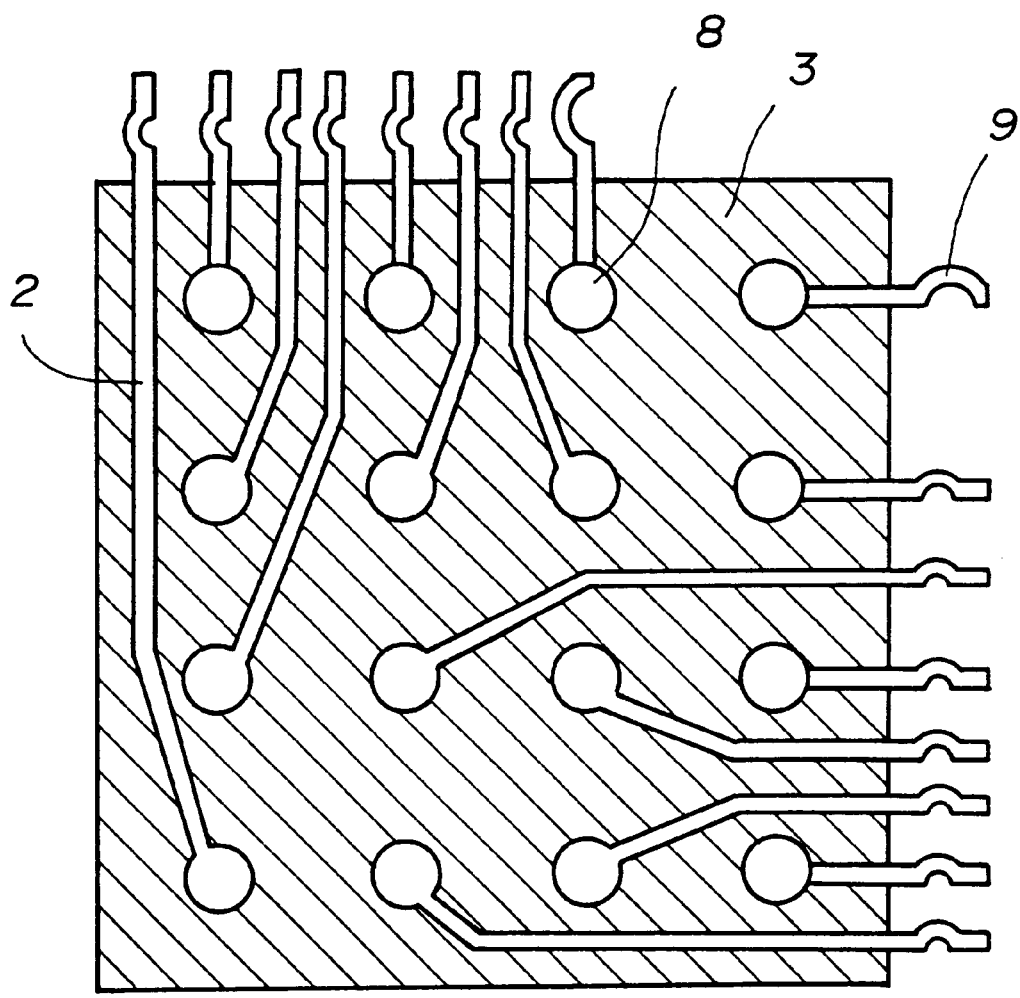
FIG. 8 is a diagram showing a plan view of a modified embodiment of the insulative board according to the present invention.

FIGS. 8 through 11 are diagrams showing various embodiments of the insulative board regarding the shape of the outer terminals 9 of the conductive pattern 2 according to the present invention. FIG. 8 is a diagram showing an embodiment of the outer terminals 9 whose end portion is curved. According to the outer terminals 9 shown in FIG. 8, stress generated upon bonding to the semiconductor chip 1 may be relieved to a greater extent compared with the one shown in FIG. 5. Also, stress caused by the difference in the thermal expansion coefficient between the semiconductor chip 1 and the mounting board may be absorbed.

Figure 9:
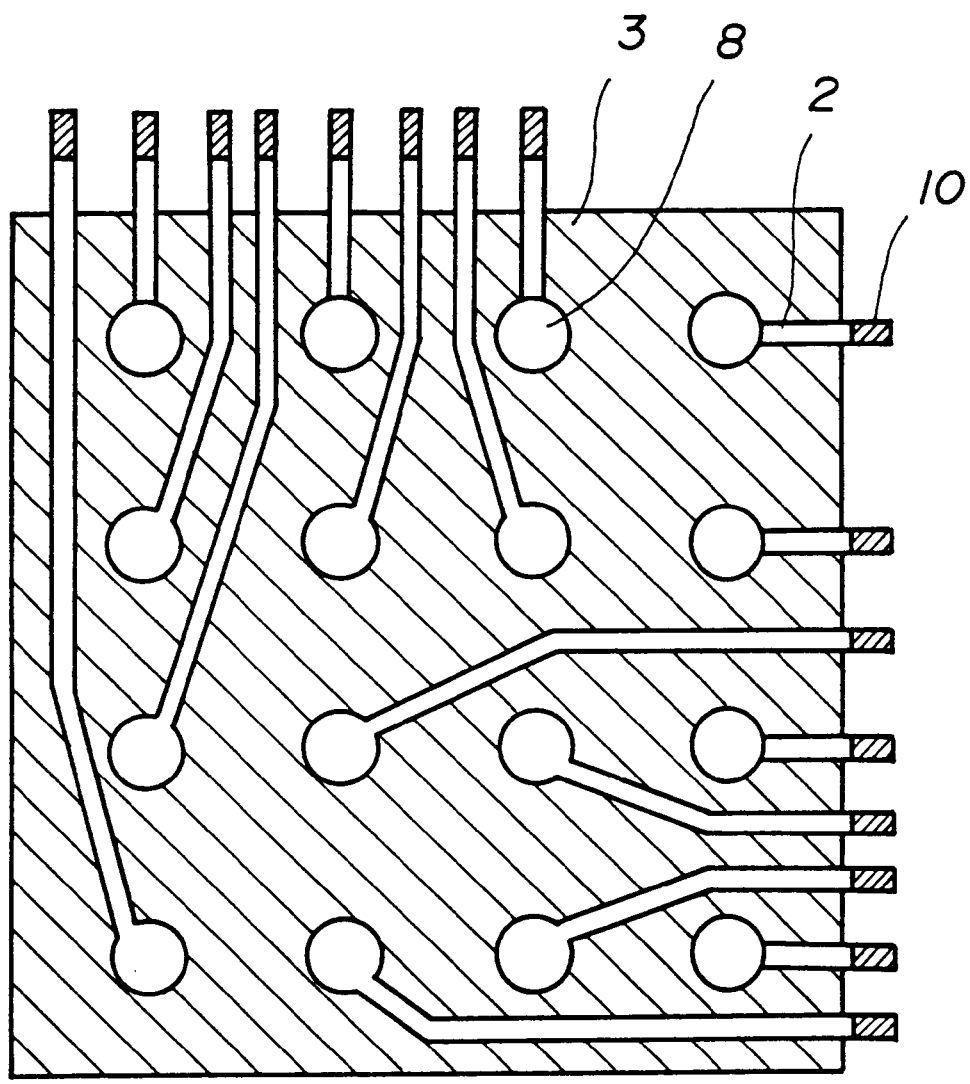
FIG. 9 is a diagram showing a plan view of a modified embodiment of the insulative board according to the present invention.

FIG. 9 is a diagram showing another embodiment of the outer terminals 9 on which a conductive bump 10 is formed at a corresponding end portion thereof. According to the outer terminals 9 shown in FIG. 9, it becomes possible to bond each of the outer terminals more strongly to the semiconductor chip 1.

Figure 10:
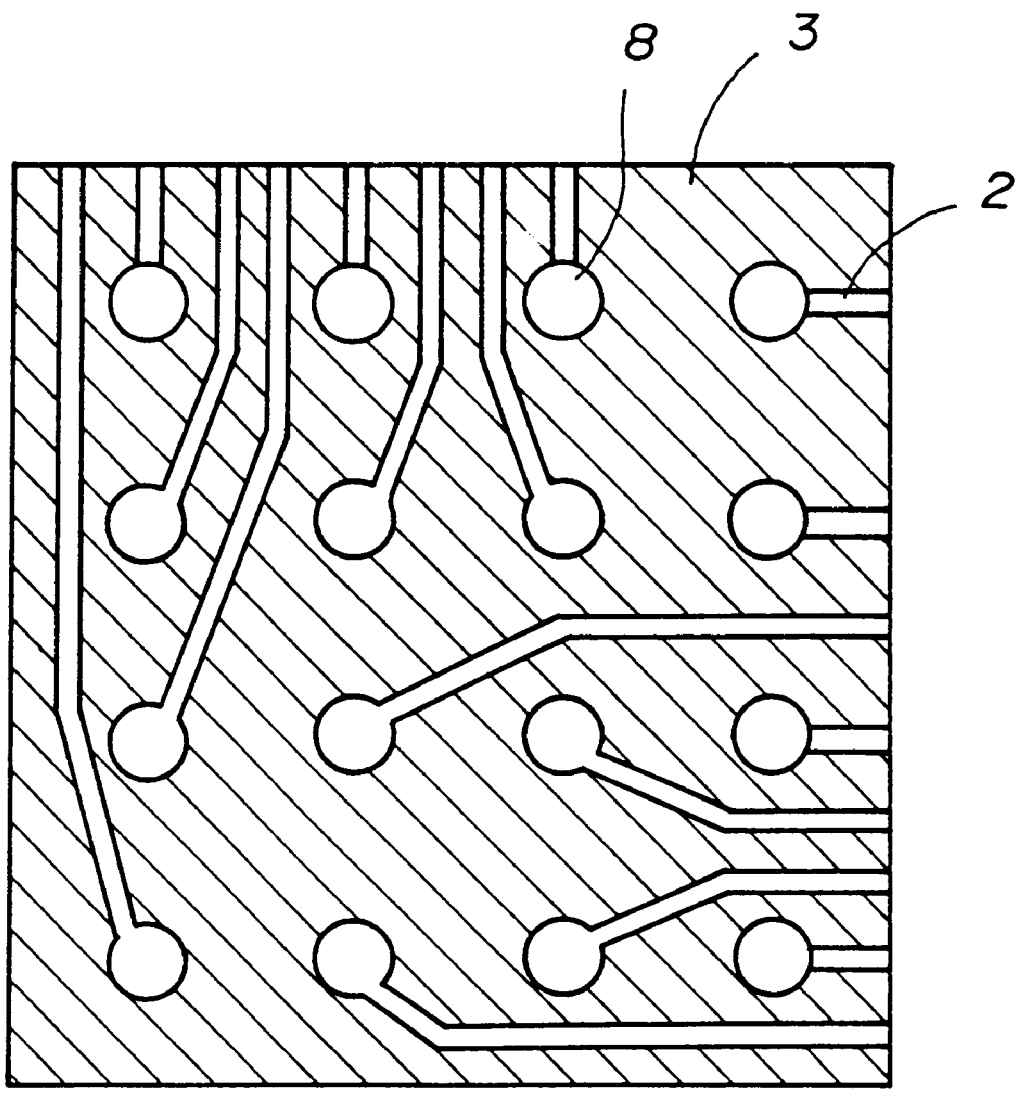
FIG. 10 is a diagram showing a plan view of a modified embodiment of the insulative board according to the present invention.

FIG. 10 is a diagram showing still another embodiment of the outer terminals 9. In this embodiment, the outer terminals 9 do not protrude from the periphery of the insulative board 3. Instead, the outer terminals 9 are exposed to the side surface of the insulative board 3 (a bonding method for this outer terminal will be explained later with reference to FIGS. 19 through 21).

Figure 11:
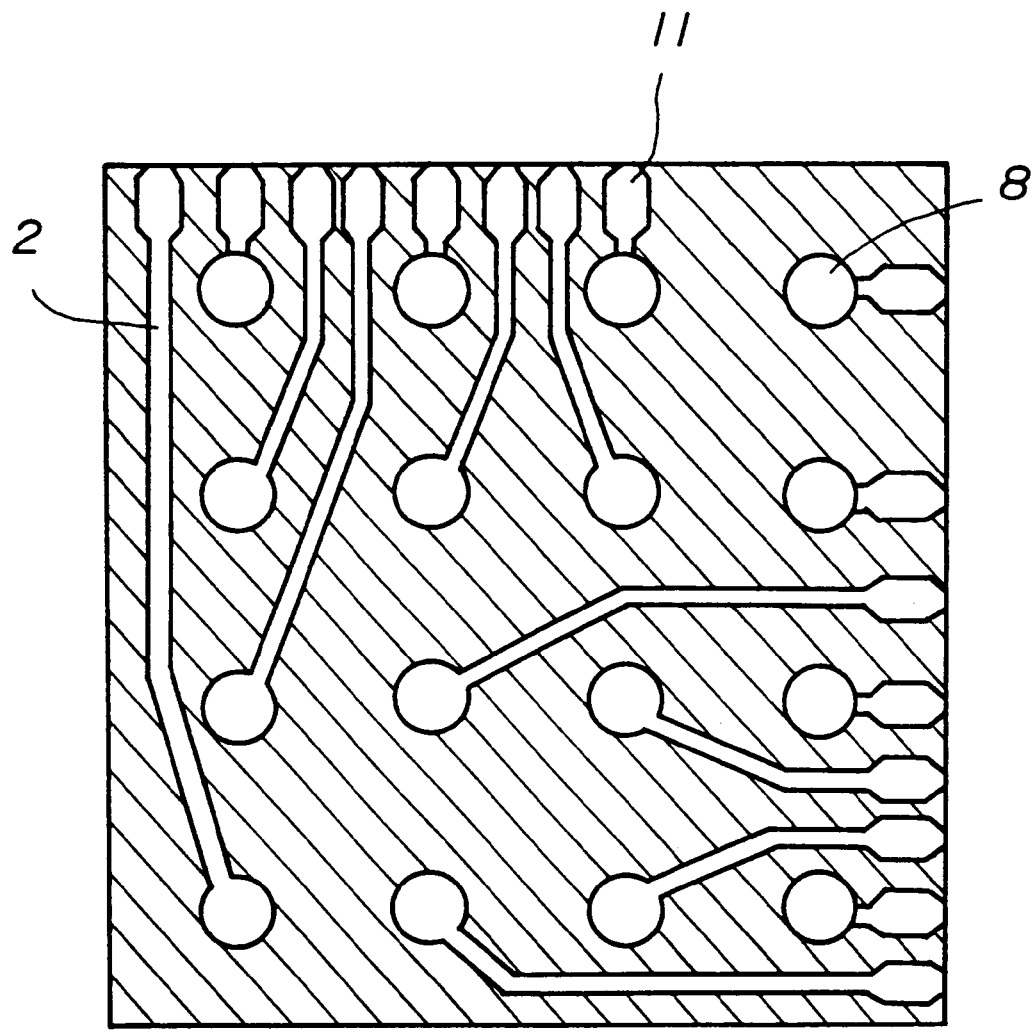
FIG. 11 is a diagram showing a plan view of a modified embodiment of the insulative board according to the present invention.

FIG. 11 is a diagram showing yet another embodiment of the outer terminals 9. In FIG. 11, the outer terminals 9 do not protrude from the periphery of the insulative board 3 as in the case shown in FIG. 10 and a bonding pad 11 is provided in the vicinity of the end portion of each of the conductive patterns 2 (a bonding method for this outer terminal will be explained later with reference to FIGS. 23 and 24).

Figure 12:
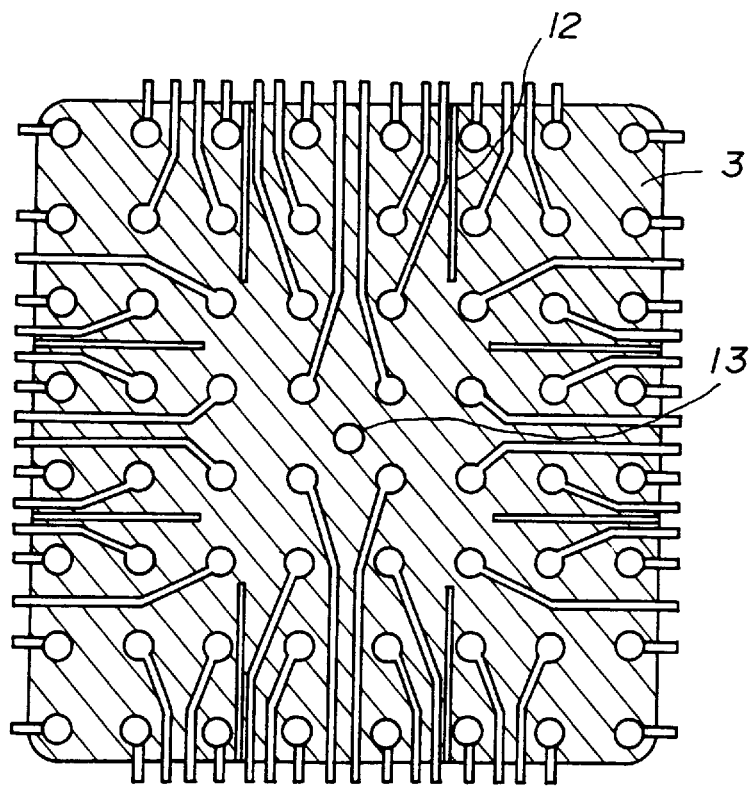
FIG. 12 is a diagram showing a plan view of a modified embodiment of the insulative board according to the present invention.

FIG. 12 is a diagram showing a modified embodiment of the insulative board 3 according to the present invention. In FIG. 12, the insulative board 3 includes slits 12 and an opening or hole 13. The slits 12 are provided in order to relieve the stress generated due to the difference in the thermal expansion coefficient between the printing board and the semiconductor chip. The opening or hole 13 is provided in order to evacuate the air upon bonding to the semiconductor chip.

Next, various embodiments of the bonding of the electrodes 14 provided on the semiconductor chip 1 to the corresponding outer terminals 9 will be described.

FIGS. 13 through 21 are diagrams showing a cross-section of a bonding portion of the electrode 14 on the semiconductor chip 1 to the outer terminal 9 in a magnified scale. In FIGS. 13 through 16, the conductive patterns are formed on the insulative board 3 as shown in FIG. 6. In FIGS. 17 through 21, the conductive patterns 2 are embedded in the insulative board 3 as shown in FIG. 7.

Figure 13:
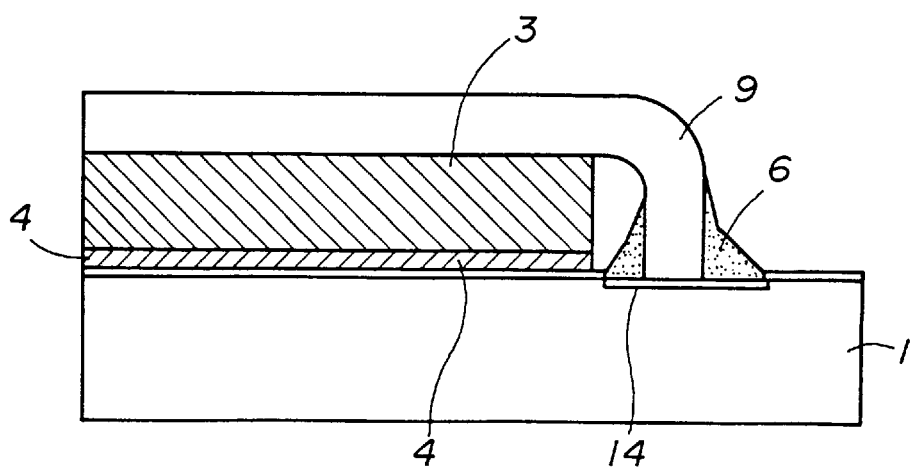
FIG. 13 is a diagram showing a cross-sectional veiw of a modified embodiment of an outer terminal according to the present invention.

In FIG. 13, the end portion of the outer terminal 9 is bent towards the semiconductor chip 1 so that it is in contact with the electrode 14 on the semiconductor chip 1. The bonding between the two is secured by wax material 6.

Figure 14:
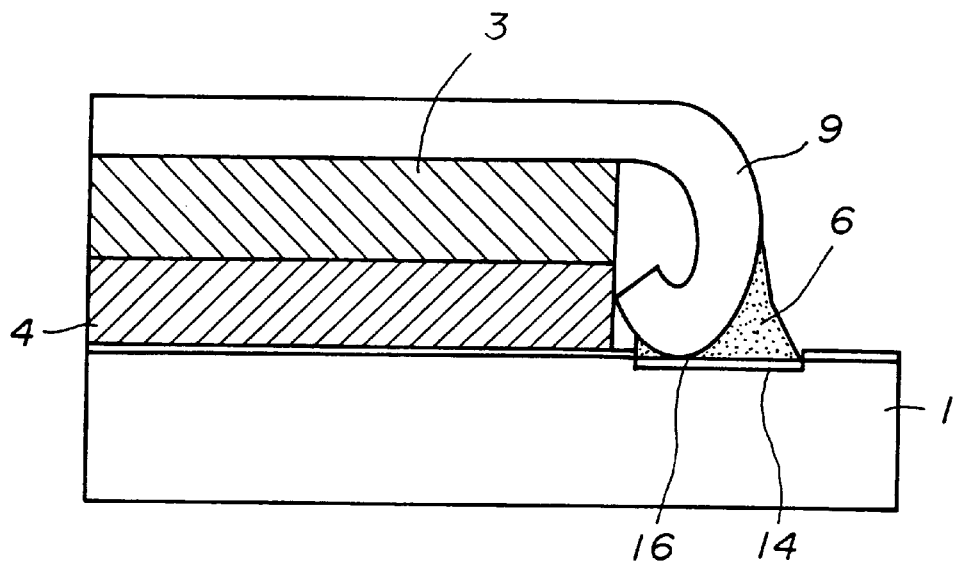
FIG. 14 is a diagram showing a cross-sectional view of a modified embodiment of the outer terminal according to the present invention.

In FIG. 14, the end portion of the outer terminal 9 is bent twice as shown in the figure and it is in contact with the electrode 14 at the portion indicated by the numeral 16. The bonding between the two is secured by wax material 6.

Figure 15:
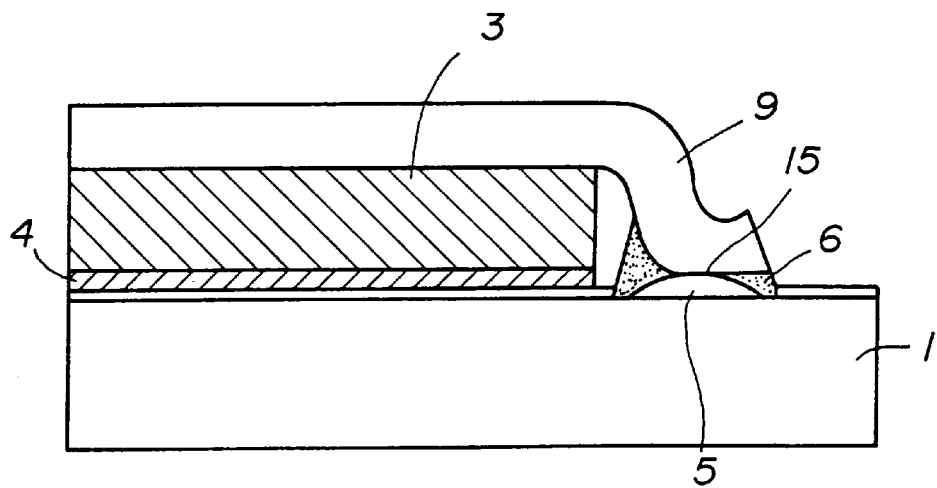
FIG. 15 is a diagram showing a cross-sectional view of a modified embodiment of the outer terminal according to the present invention.

In FIG. 15, the end portion of the outer terminal 9 is bent twice in the different directions as shown in the figure and it is in contact with the bump 5 at the portion indicated by the numeral 15. The bonding between the two is secured by wax material 6. In this configuration, the difference in height among the plurality of bumps 5 formed on the respective electrodes can be absorbed by the outer terminal 9. Also, since the outer terminal 9 is bent, it is not necessary to form a bump of a great height to secure the connection with the electrode 14.

Figure 16:
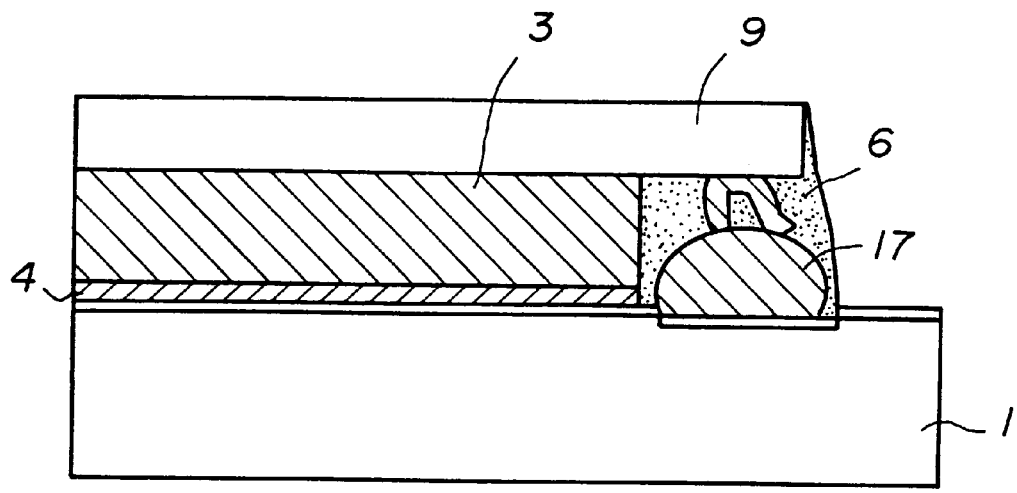
FIG. 16 is a diagram showing a cross-sectional view of a modified embodiment of the outer terminal according to the present invention.

In FIG. 16, the end portion of the outer terminal 9 is in contact with a cutwire which is a part of a bump 17. The bonding between the two is secured by wax material 6. The bump 17 shown in the figure may be formed by using a wire-bonding technique—first carrying out a wire-bonding on the electrode 14, then forming the wire into a loop shape, and finally cutting the wire. In this configuration, the difference in height among the bumps 17 may also be absorbed by the outer terminals 9.

Figure 17:
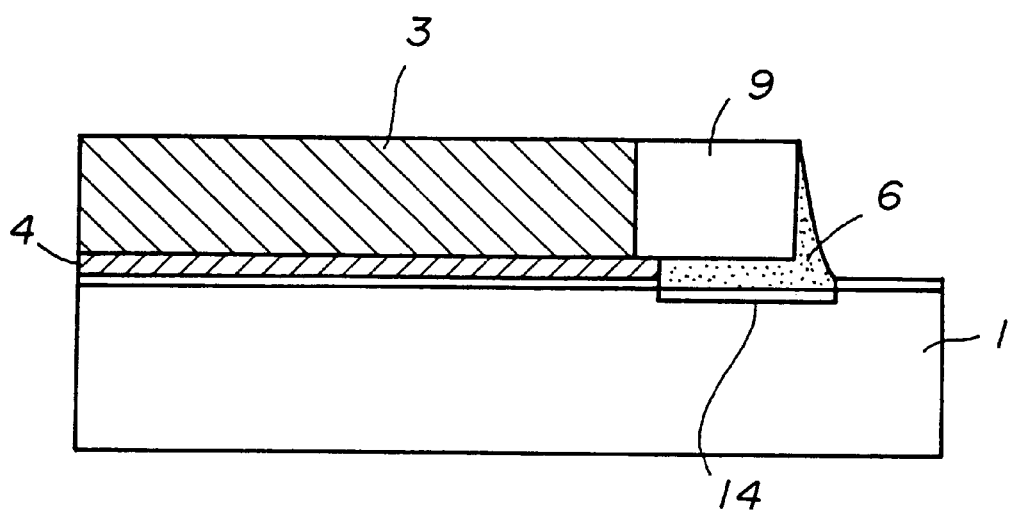
FIG. 17 is a diagram showing a cross-sectional view of a modified embodiment of the outer terminal according to the present invention.

In FIG. 17, the end portion of the outer terminal 9 is in contact with the electrode 14 and is directly bonded by using wax material 6.

Figure 18:
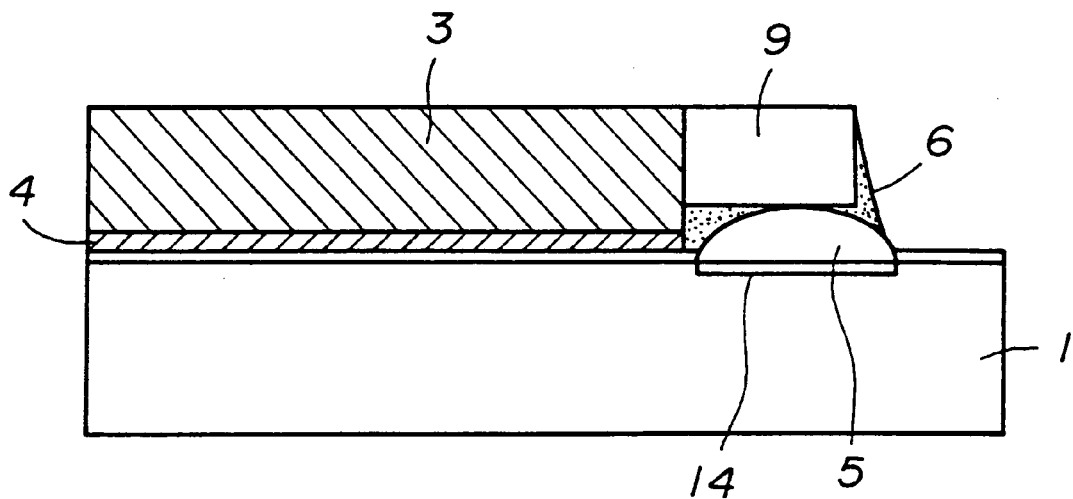
FIG. 18 is a diagram showing a cross-sectional view of a modified embodiment of the outer terminal according to the present invention.

In FIG. 18, the end portion of the outer terminal 9 is in contact with the bump 5 formed on the electrode 14 of the semiconductor chip 1 and is bonded by wax material 6.

Figure 19:
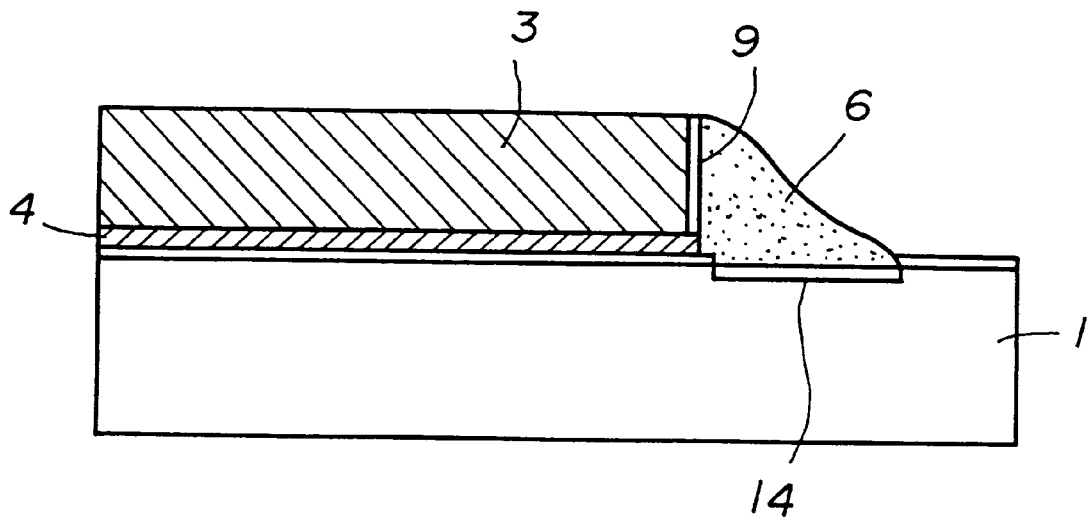
FIG. 19 is a diagram showing a cross-sectional view of a modified embodiment of the outer terminal according to the present invention.

FIG. 19 is a diagram showing a cross section of the insulative board 3 shown in FIG. 10. In FIG. 19, the outer terminal 9 is directly bonded to the electrode 14 of the semiconductor chip 1 by wax material 6.

Figure 20:
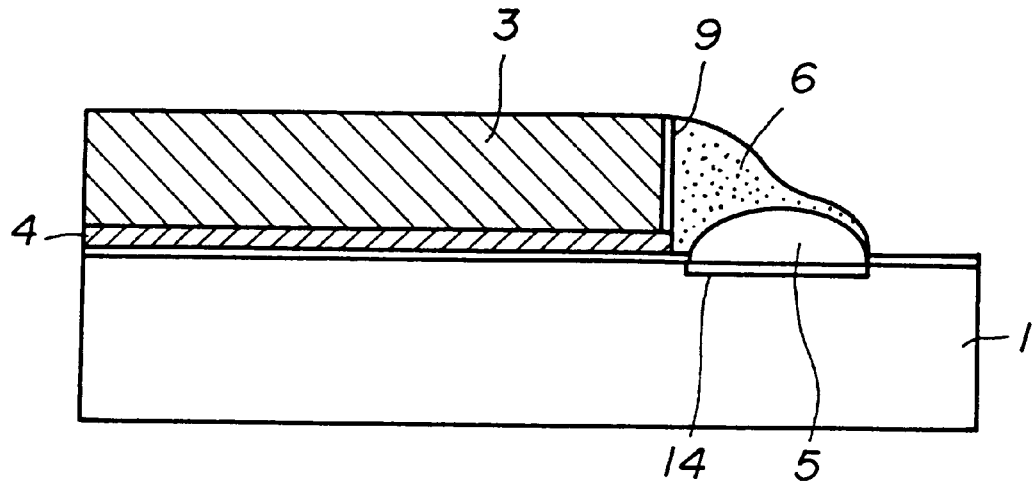
FIG. 20 is a diagram showing a cross-sectional view of a modified embodiment of the outer terminal according to the present invention.

FIG. 20 is a diagram showing a cross section of the insulative board 3 shown in FIG. 10. In FIG. 20, the outer terminal 9 is directly bonded to the bump 5 formed on the electrode 14 of the semiconductor chip 1 by wax material 6.

Figure 21:
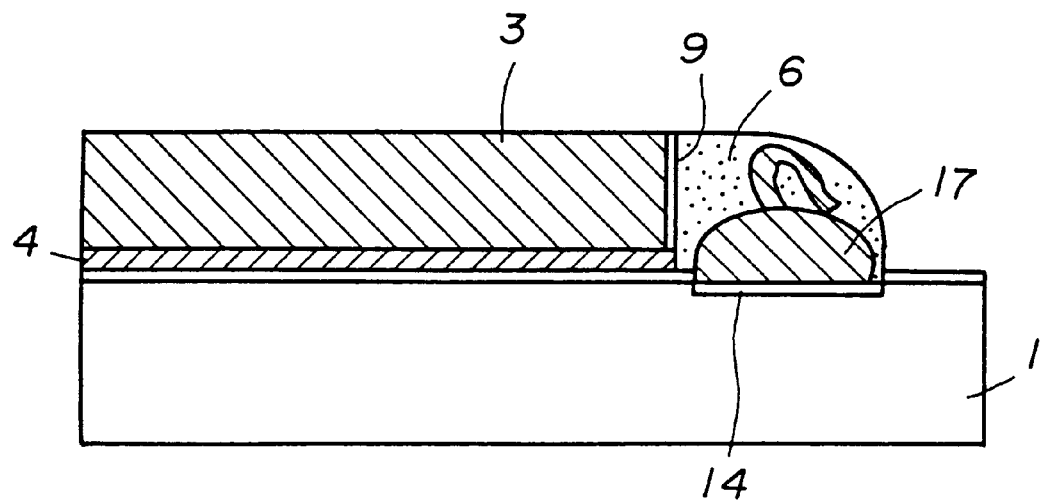
FIG. 21 is a diagram showing a cross-sectional view of a modified embodiment of the outer terminal according to the present invention.

FIG. 21 is a diagram showing a cross section of the insulative board 3 shown in FIG. 10. In FIG. 19, the outer terminal 9 is in contact with the cutwire of the bump 17 formed by the wire-bonding and the contact is secured by wax material 6.

Figure 22A:
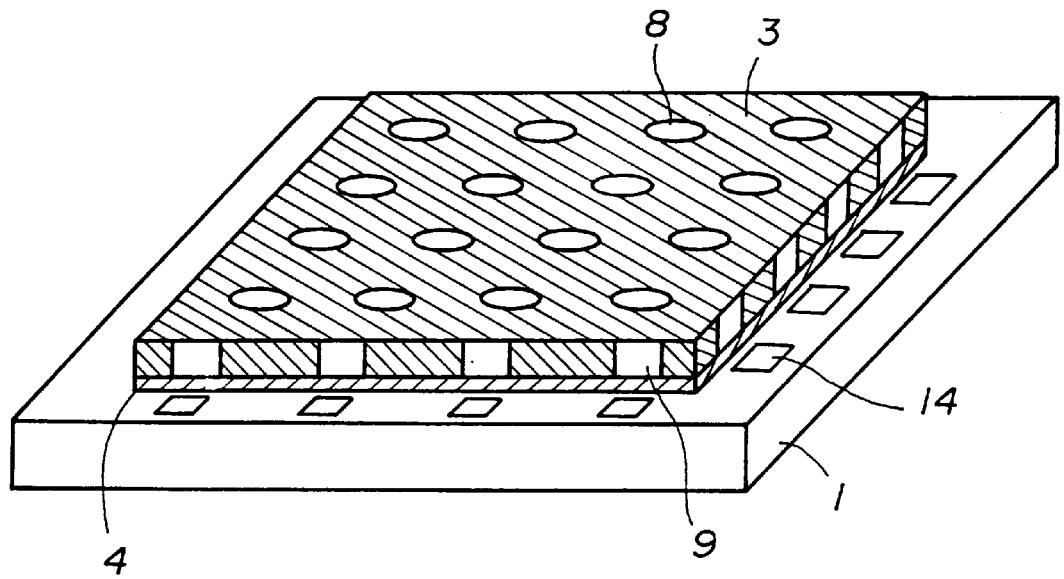
FIG. 22A is a diagram showing a perspective view of a semiconductor device according to an embodiment of the present invention.
Figure 22B:
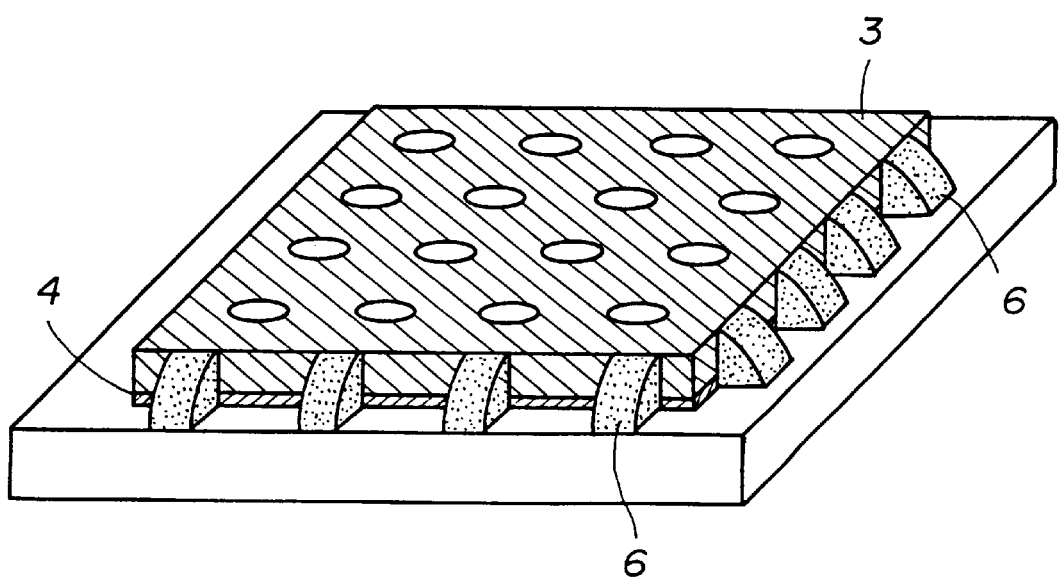
FIG. 22B is a diagram showing a perspective view of a semiconductor device according to an embodiment of the present invention.

FIGS. 22A and 22B, respectively, are diagrams showing a perspective view of the semiconductor device according to the embodiment of the present invention in which the outer terminals 9 are exposed at the side surface of the insulative board. FIG. 22A shows a state in which the insulative board 3 is mounted by performing a positioning process with respect to the semiconductor chip 1. FIG. 22B shows a state in which the outer terminals 9 are bonded to the respective electrode 14 by wax material 6.

Figure 1:
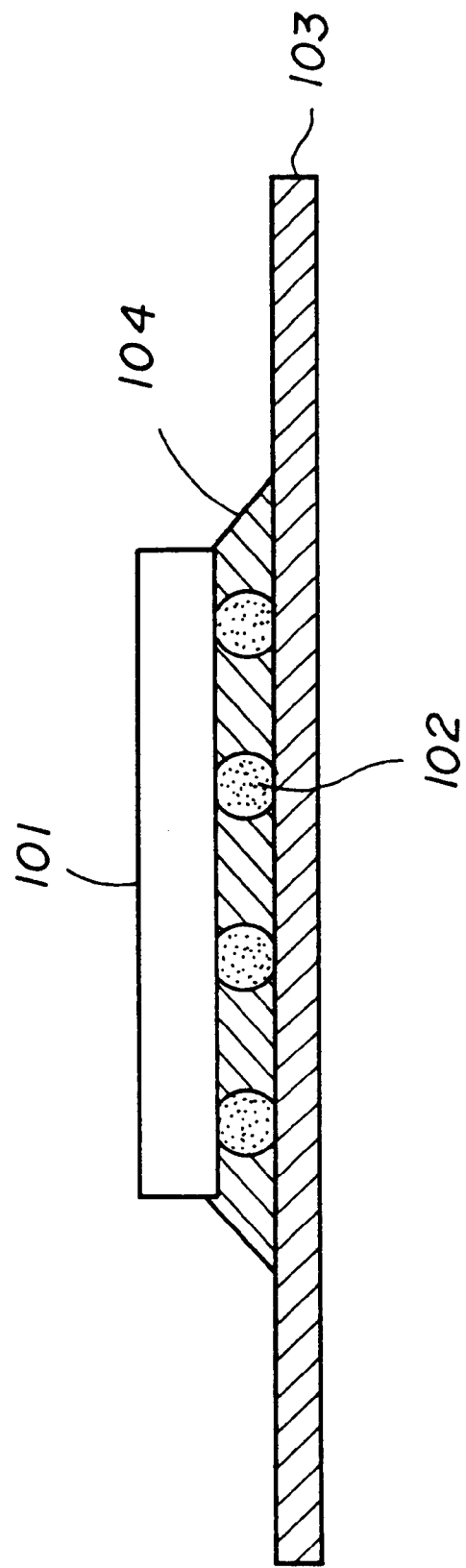
FIG. 1 is a diagram showing a conventional flip-chip type semiconductor device.

As shown in FIGS. 22A and 22B, by using the type of the semiconductor device in which the outer terminals are exposed at the side surface of the insulative board 3, it becomes possible to form the insulative board 3 closer to the electrodes 14. Thus, the size of the insulative board 3 may be increased as compared with the one shown in FIG. 1, and hence the region for the conductive pattern may also be increased.

Figure 23:
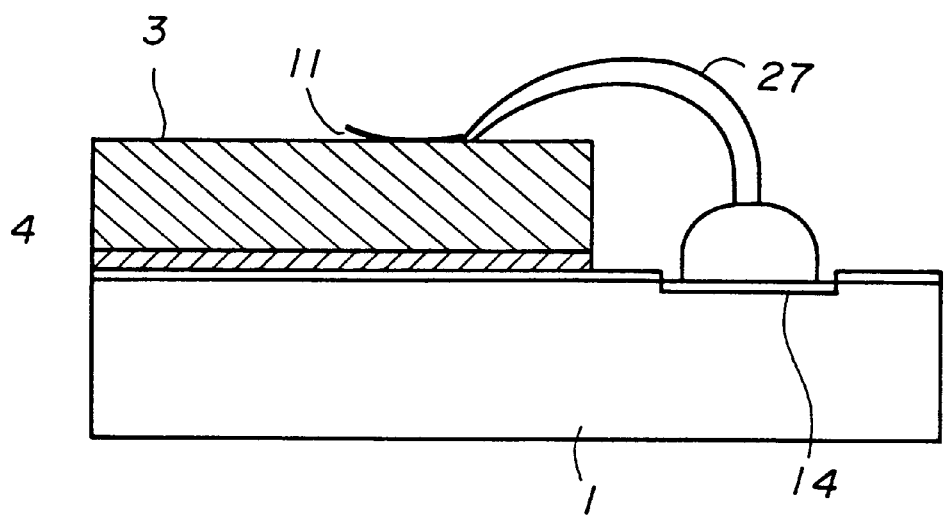
FIG. 23 is a diagram showing a cross-sectional view of a modified embodiment of the outer terminal according to the present invention.

FIG. 23 is a diagram showing a cross section of the semiconductor device according to an embodiment of the present invention in which the insulative board 3 is the one shown in FIG. 11. In FIG. 23, the bonding pad 11 provided on the insulative board 3 is bonded to the electrode 14 formed on the semiconductor chip 1 by a bonding wire 27. In this configuration, the bonding wire 27 functions as the above-mentioned-outer terminal. The bonding wire shown in FIG. 23 can also absorb any stress which is generated.

Figure 24:
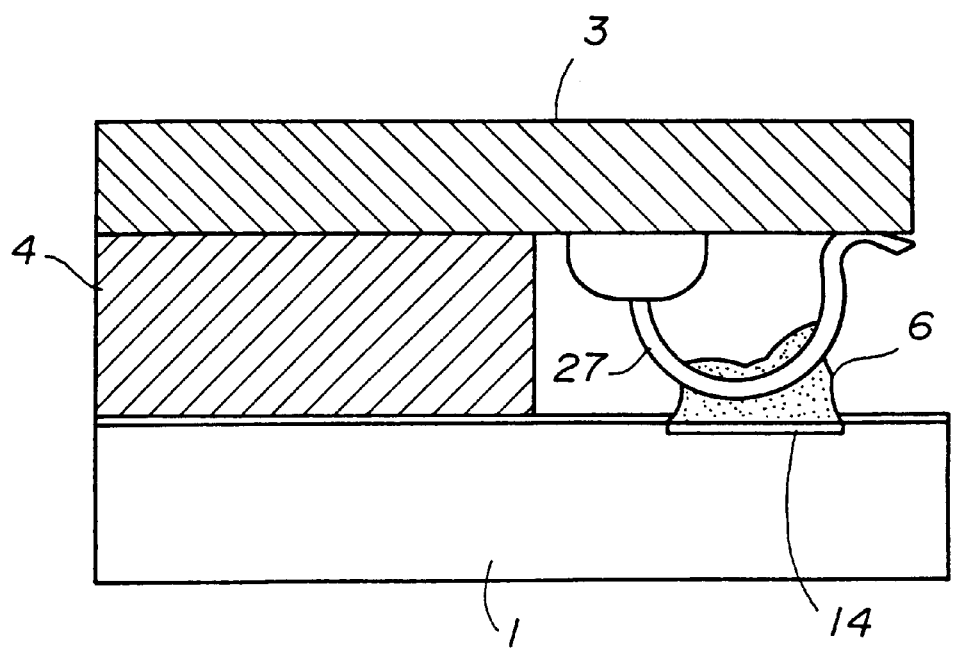
FIG. 24 is a diagram showing a cross-sectional view of a modified embodiment of the outer terminal according to the present invention.

FIG. 24 is a diagram showing a cross section of the semiconductor device according to another embodiment of the present invention in which the insulative board 3 is the one in FIG. 11. In FIG. 24, a loop is formed by the bonding wire 27 on the bonding pad of the insulative board 3 and the end of the loop is bonded to the electrode 14 of the semiconductor chip 1 by using wax material 6. Since a bonding wire 27 is shaped in the loop, the above-mentioned stress may be absorbed.

Although the electrodes 14 are formed around the semiconductor chip 1 in the above-mentioned modified embodiments, it is possible to provide the electrodes 14 at the center of the device in one row or in a cross shape. In such cases, it is necessary to adjust the shape of the insulative board 3 and the conductive patterns 2 in accordance with the shape of the electrodes 14.

Next, a method for producing a semiconductor device in which the outer terminals 9 are protruded from the periphery of the insulative board 3 according to an embodiment of the present invention will be described.

Figure 25:
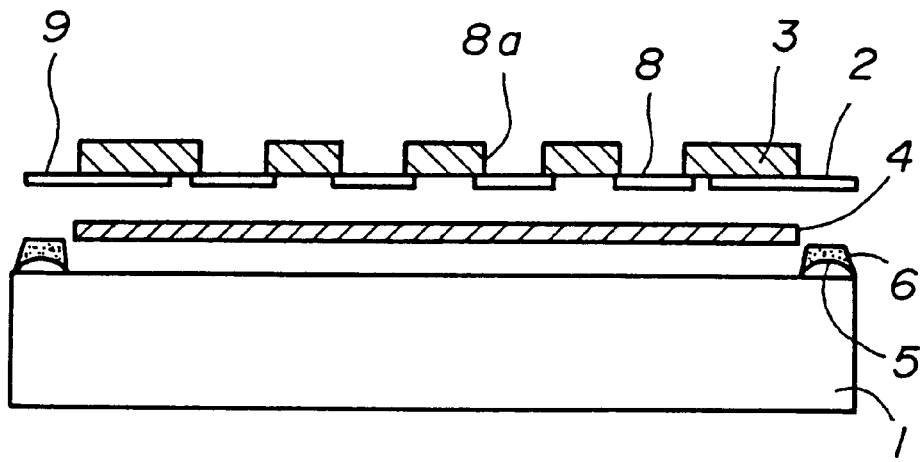
FIG. 25 is a diagram for explaining a structure and a method for producing the semiconductor device according to an embodiment of the present invention.
Figure 26:
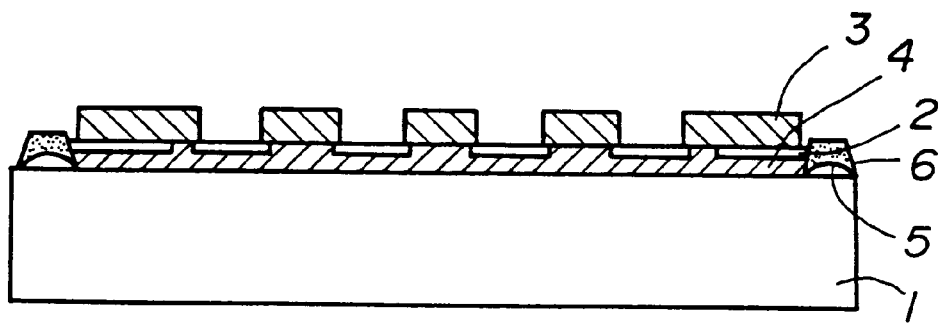
FIG. 26 is a diagram for explaining a structure and a method for producing the semiconductor device according to an embodiment of the present invention.

First, as shown in FIGS. 25 and 26, the position of the insulative board 3 on which conductive patterns 2 are formed and the position of the bumps 5 are adjusted so that the insulative board 3 is properly mounted on the semiconductor chip 1 via an elastic adhesive layer 4. At this time, a conductive wax material such as solder (Pb/Sn), silver paste, and an epoxy-type conductive adhesive composition are already provided on the bumps 5. It is possible to apply the wax material on the outer terminals 9.

Figure 27:
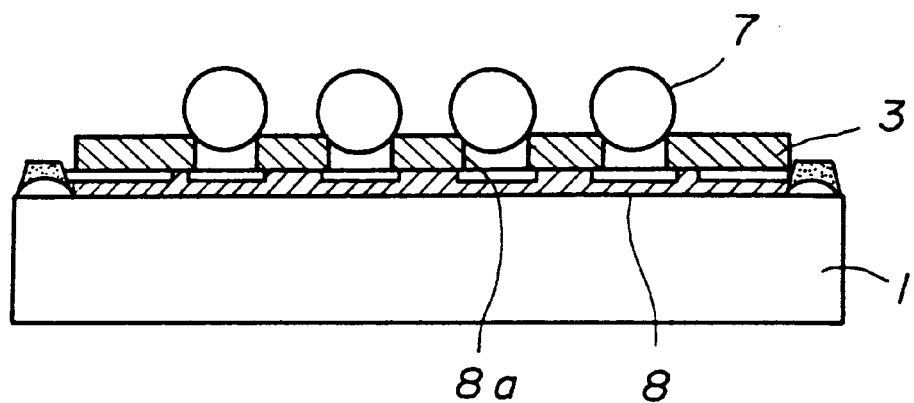
FIG. 27 is a diagram for explaining a structure and a method for producing the semiconductor device according to an embodiment of the present invention.

Then, as shown in FIG. 27, position of each bump 7 of a ball shape made of solder is adjusted to the position of a corresponding opening 8a formed in the insulative board 3.

Figure 28:
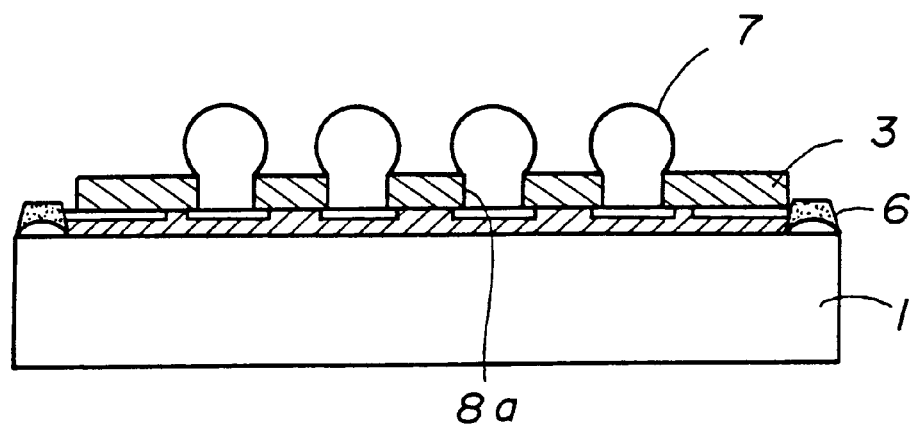
FIG. 28 is a diagram for explaining a structure and a method for producing the semiconductor device according to an embodiment of the present invention.

After that, as shown in FIG. 28, the semiconductor chip 1 on which the insulative board 3 and the bumps 7 are mounted is heated so that wax material 6 is cured. At the same time, the bumps 7 are melted by heat and fill the openings 8a with the constituents thereof so that it is in contact with a corresponding land 8.

Figure 29:
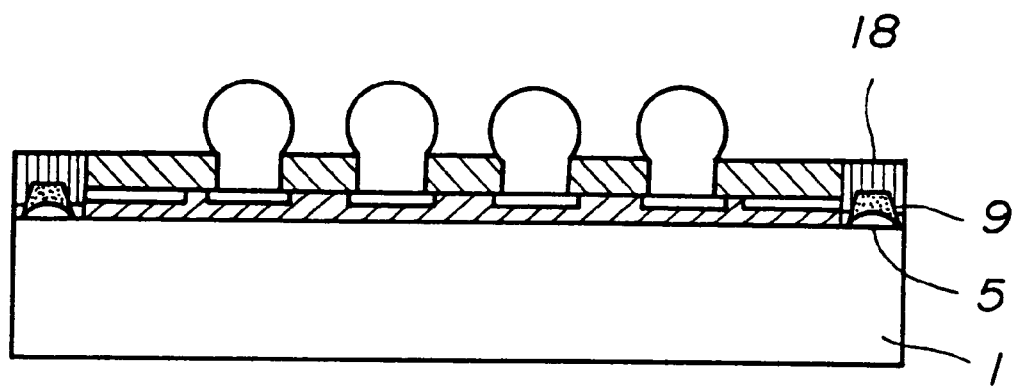
FIG. 29 is a diagram for explaining a structure and a method for producing the semiconductor device according to an embodiment of the present invention.

Finally, as shown in FIG. 29. the bonding portion between the outer terminal 9 and the bum 5 is sealed by a sealing resin 18. The sealing process may be performed by forming the sealing resin 18 by, for example, a transfer mold, or by a potting operation in which the resin is dropped from the top.

Figure 30:
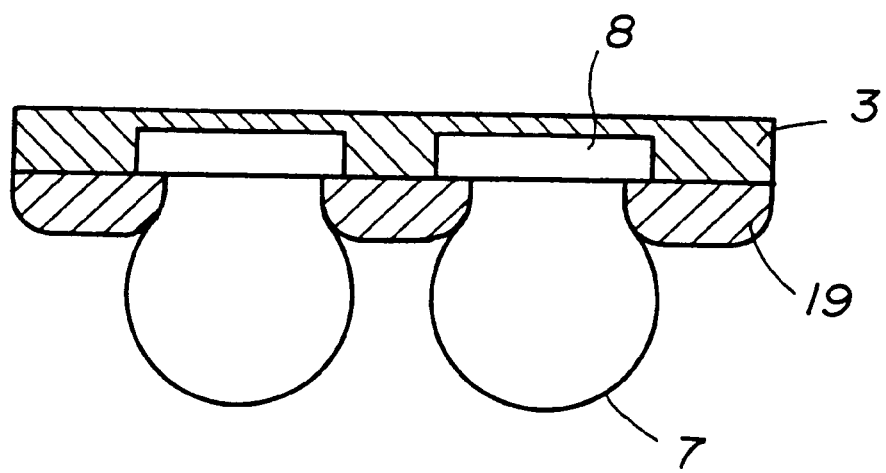
FIG. 30 is a diagram for explaining a modified embodiment of the method for producing the semiconductor device according to the present invention.
Figure 31:
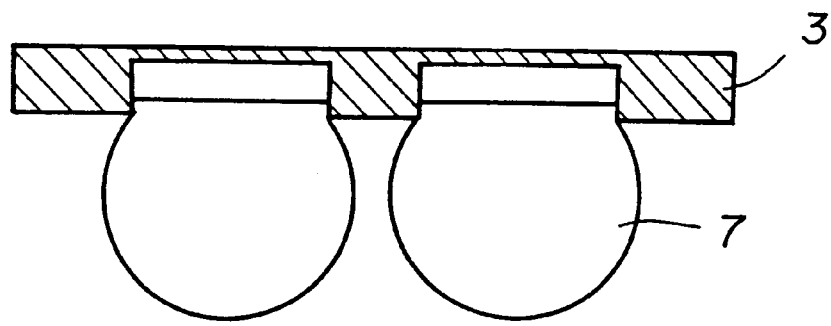
FIG. 31 is a diagram for explaining a modified embodiment of the method for producing the semiconductor device according to the present invention.

On the other hand, when the conductive patterns are embedded in the insulative board 3 as shown in FIG. 7, the contact between the bump 7 and the land 8 may be secured in the manner shown in FIGS. 30 and 31.

In FIG. 30, the land 8 is opened by using resist 19 and the bump 7 is embedded in the opening in the same manner as explained in FIGS. 25 through 29.

In FIG. 31, the resist shown in FIG. 30 is removed and the shape of the bump 7 is made spherical by applying heat thereto.

Figure 32:
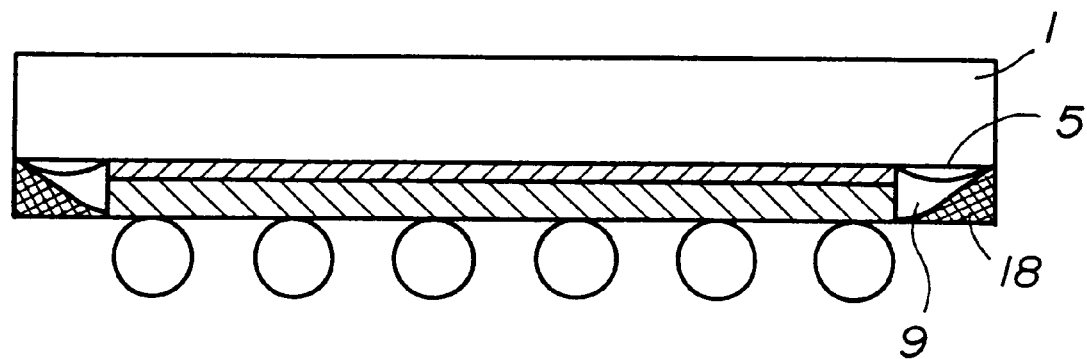
FIG. 32 is a diagrams showing a sealing structure according to the present invention.
Figure 33:
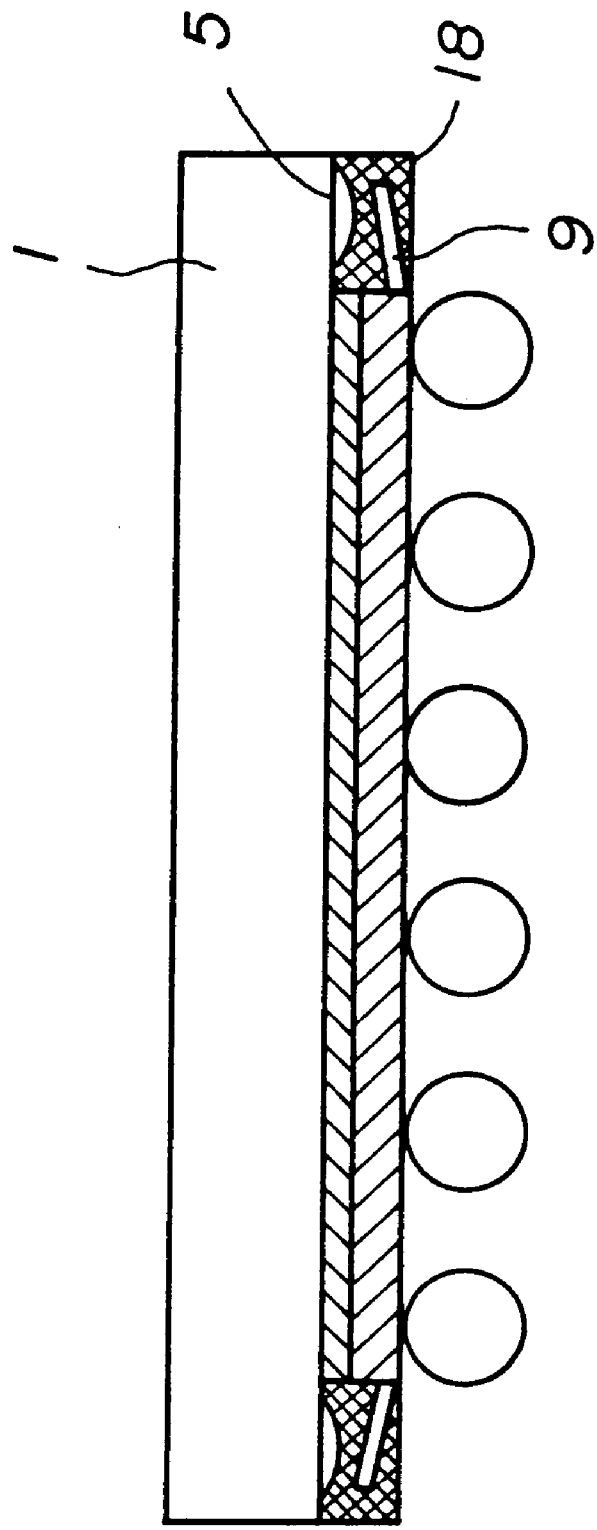
FIG. 33 is a diagram showing a sealing structure according to the present invention.

Also, as shown in FIGS. 32 and 33, the sealing resin 18 may improve the reliability of the bonding portion between the outer terminal 9 and the bump 5 regardless of the shape of the outer terminal 9.

A method for producing a semiconductor device in which the outer terminals 9 are not protruded from the periphery of the insulative board 3 as shown in FIG. 10 is substantially the same as the above-explained method except that the wax material is formed on the electrode 14 by squeezing via a metal mask and the electrode 14 is bonded to the outer terminal 9 by heating the wax material after the position of the insulative board 3 is adjusted with respect to the semiconductor chip 1 as shown in FIGS. 22A and 22B.

Also, a method for producing a semiconductor device in which the insulative board and the electrodes of the semiconductor chip are connected by the respective bonding wire is substantially the same as the above-mentioned method except that the wire bonding is formed so as to connect the bonding pad of the insulative board with the corresponding electrode of the semiconductor chip after the position of the insulative board is adjusted with respect to the semiconductor chip.

The present invention is not limited to the above-mentioned embodiments, and variations and modifications may be made without departing from the scope of the present invention.

What is claimed is:

1. A semiconductor device comprising:

a semiconductor chip;

a plurality of electrodes provided on a surface of said semiconductor chip;

an insulative board which includes a plurality of conductive patterns, one end of each of said plurality of conductive patterns protruding laterally from a peripheral edge of said insulative board so as to finction as an outer terminal;

a connecting means for electrically connecting said outer terminal to a corresponding one of said plurality of electrodes; and a conductive element which is in electrical contact with a corresponding one of said plurality of conductive patterns.

2. The semiconductor device as claimed in claim 1, wherein said insulative board is provided on said surface of said semiconductor chip so that peripheral portions of said insulative board are positioned in the vicinity of said plurality of electrodes.

3. The semiconductor device as claimed in claim 2, wherein an elastic adhesive layer is provided between said insulative board and said semiconductor chip.

4. The semiconductor device as claimed in claim 1, wherein a land having a greater width than said plurality of conductive patterns is provided at an end portion of a corresponding one of said plurality of conductive patterns.

5. The semiconductor device as claimed in claim 4, wherein a plurality of opening portions are provided in said insulative board corresponding to positions of said land.

6. The semiconductor device as claimed in claim 5, wherein said conductive element is a bump, a portion of said bump being embedded in a corresponding one of said plurality of opening portions so as to be in contact with said land and another portion of said bump protecting from said insulative board.

7. The semiconductor device as claimed in claim 1, wherein said plurality of conductive patterns are embedded in said insulative board.

8. The semiconductor device as claimed in claim 1, wherein said outer terminal is in a curved shape.

9. The semiconductor device as claimed in claim 1, wherein said insulative board includes a central hole and slits extending from said periphery of said insulative board toward a center portion of said insulative board.

10. The semiconductor device as claimed in claim 1, wherein said outer terminal has a bent shape so as to be in electrical contact with a corresponding one of said plurality of electrodes.

11. The semiconductor device as claimed in claim 1, wherein a sealing resin is provided on a portion connecting said outer terminal to a corresponding one of said plurality of electrodes.

12. A semiconductor device comprising:

a semiconductor chip;

a plurality of electrodes provided on a surface of said semiconductor chip;

an insulative board which includes a plurality of conductive patterns, one end of each of said plurality of conductive patterns being exposed at a side surface of said insulative board so as to function as an outer terminal wherein said side surface of said insulative board is contained within an inner region with respect to said plurality of electrodes provided in said surface of said semiconductor chip; and a connecting means for electrically connecting said outer terminal to a corresponding one of said plurality of electrodes.

13. The semiconductor device as claimed in claim 12, wherein said insulative board is provided on said surface of said semiconductor chip so that peripheral portions of said insulative board are positioned in the vicinity of said plurality of electrodes.

14. The semiconductor device as claimed in claim 13, wherein an elastic adhesive layer is provided between said insulative board and said semiconductor chip.

15. The semiconductor device as claimed in claim 12, wherein a sealing resin is provided on a portion connecting said outer terminal to a corresponding one of said plurality of electrodes.

* * * * *